US006933793B2

United States Patent
Patterson, III et al.

(10) Patent No.: US 6,933,793 B2
(45) Date of Patent: Aug. 23, 2005

(54) METHOD OF OVERTONE SELECTION AND LEVEL CONTROL IN AN INTEGRATED CIRCUIT CMOS NEGATIVE RESISTANCE OSCILLATOR TO ACHIEVE LOW JITTER (75) Inventors: Raymond B. Patterson, III, Melbourne, FL (US); Randy T. Heilman, Melbourne, FL (US)

(73) Assignee: Vitesse Semiconductor Corporation, Camarillo, CA (US)

( * ) Notice: Subject to any disclaimer, the term of this patent is extended or adjusted under 35 U.S.C. 154(b) by 0 days.

(21) Appl. No.: 10/721,910

(22) Filed: Nov. 24, 2003

(65) Prior Publication Data
US 2005/0035804 A1 Feb. 17, 2005

Related U.S. Application Data (63) Continuation of application No. 10/346,557, filed on Jan. 16, 2003, now abandoned, which is a continuation of application No. 10/163,860, filed on Jun. 5, 2002, now abandoned.
(60) Provisional application No. 60/296,321, filed on Jun. 5, 2001.

(51) Int. Cl.$^7$ ............................ H03B 5/30; H03B 5/32; H03B 5/36; H03B 7/00
(52) U.S. Cl. ................... 331/76; 331/115; 331/116 FE; 331/132; 331/154; 331/158; 331/183
(58) Field of Search .............................. 331/74–77, 115, 331/116 R, 116 FE, 116 M, 117 R, 117 FE, 117 D, 132, 154, 156, 158, 175, 182–183

(56) References Cited

U.S. PATENT DOCUMENTS

| 5,444,422 A | | 8/1995 | Mycynek |
| 6,081,164 A | * | 6/2000 | Shigemori et al. ............ 331/16 |
| 6,215,370 B1 | | 4/2001 | Hasegawa et al. |

OTHER PUBLICATIONS

International Search Report for International Application No. PCT/US02/18252, filed Jun. 5, 2002, mailed Jan. 2, 2003 (3 pgs.).
Long, "Frequency Correlation Of Quartz Crystal Oscillators", RF Expo East, 1990, http://www/corningfrequency. com/piezo/papers/fcqc.html, printed Jun. 12, 2001 (14 pgs.).

* cited by examiner

Primary Examiner—David Mis
(74) Attorney, Agent, or Firm—Christie, Parker & Hale, LLP (57) ABSTRACT A stable high-frequency clock pulse apparatus and method including frequency source, overtone crystal unit coupled with a negative resistance oscillator, a bandpass overtone filter and a drive level control is provided. The apparatus can include a frequency multiplier. The frequency source can be a micromechanical resonator.

20 Claims, 8 Drawing Sheets

METHOD OF OVERTONE SELECTION AND LEVEL CONTROL IN AN INTEGRATED CIRCUIT CMOS NEGATIVE RESISTANCE OSCILLATOR TO ACHIEVE LOW JITTER

CROSS-REFERENCE TO RELATED APPLICATIONS

This application is a continuation of U.S. application Ser. No. 10/346,557, filed Jan. 16, 2003, now abandoned, which is a continuation of U.S. application Ser. No. 10/163,860, filed Jun. 5, 2002, now abandoned, which application claims the benefit of U.S. provisional Application No. 60/296,321, filed Jun. 5, 2001, the disclosure of which is incorporated by reference.

BACKGROUND

The present invention generally relates to generating clock pulses and in particular to generating a stable high-speed clock pulse train by employing a negative resistance oscillator operating at an overtone frequency of a resonator.

Applications such as communications, video processing, data acquisition and recovery, and high-bandwidth test systems require stable high frequency clocks to meet specific performance demands and provide periodic and accurately spaced signals. Most clocks include an electronic device, e.g., an oscillator, to generate an accurate oscillating signal. This signal oscillation is based on a periodic event that, under the control of a resonator, repeats at a natural and substantially constant rate, i.e., a fundamental or resonance frequency.

Stability is an inherent property that determines how well an oscillator can produce the same frequency over a given time interval. The more stable the oscillator, the more accurately the fundamental frequency is produced, and the less variations there will be in signal characteristics. Additionally, quality factor, or Q, is another inherent oscillator quality that influences stability. In general, oscillators having a high quality factor tend to be more stable, experience fewer signal characteristic variations, and operate in a range close to its natural resonance frequency.

Conventional oscillators, often utilize a crystal unit to generate an oscillating signal, e.g., a clock pulse train, and ideally maintain a constant spacing between clock transitions. However, in some applications short-term leading or lagging variations of the significant instants of the oscillating signal from its ideal positions in time occur, such that the transition spacing varies. This uncertainty, called clock jitter, directly affects timing margins and hence limits system performance. Clock jitter can be caused by temperature and voltage variations over time; changing environmental conditions; manufacturing variations; and so forth. Jitter may be characterized by the abrupt and unwanted variations of one or more signal characteristics, such as the interval between successive pulses, the amplitude of successive cycles, or the frequency or phase of successive cycles. Oscillators using crystal units are often plagued by jitter effects.

For instance, as a drive current through a crystal unit increases, the crystal's amplitude of vibration also increases, and jitter effects due to the nonlinearities of quartz can become more pronounced. In general, the frequency change with drive level of the oscillator is proportional to the square of the drive current. Thus, drive current fluctuations, such as those resulting from drive or voltage source variations, can induce frequency fluctuations in the crystal unit. In addition, resistive properties of crystal units can increase non-linearly with the drive current. Therefore variations in the drive current can inject undesirable instabilities into an oscillator, and thus, be an additional source of jitter.

Some conventional oscillators employ a Colpitts configuration, in which a quartz crystal is operated at its fundamental frequency in the parallel mode, and is connected in the positive feedback loop of the oscillator sustaining circuit/amplifier. However, most applications require operating frequencies substantially higher than the natural resonance or fundamental frequency of a crystal. Unfortunately, high frequency fundamental mode crystals, for example, above 20 MHz, can be expensive and be difficult to manufacture. Also, high frequency fundamental mode crystals tend to have less stability and greater aging rates.

As such, various techniques can be used to multiply the fundamental frequency to produce the actual output frequency of the oscillator. For example, a device such as a phase-locked loop (PLL) can be used to multiply the fundamental frequency to a desired operating frequency. Although achieving frequencies higher than the fundamental frequency, PLLs require additional circuitry which increases the number of possible sources of jitter. Indeed, jitter introduced by a PLL is generally proportional to the square of the number of stages in the PLL. Moreover, the effects of jitter can be magnified as operating frequencies increase.

Additionally, some applications, such as data transmission system designs, e.g., SONET, Gigabit Ethernet, and Fiber Channel, employ circuits operating at high frequencies, and place strict demands on the allowable jitter for the system's reference clock oscillator. Excessive clock jitter can degrade the system performance due to uncertainty in the position of the signal's rising edge which in turn causes an unacceptable bit error rate.

SUMMARY OF THE INVENTION

The invention provides a stable high-frequency clock pulse apparatus and method. The clock pulse apparatus provides a clock pulse signal at a predetermined clock operating frequency. The apparatus includes a frequency source producing a source signal oscillating at a source frequency. The source frequency is substantially the same as the predetermined clock operating frequency. The frequency source is coupled with a negative resistance oscillator. The oscillator amplifies and feeds back at least a portion of the source signal to the frequency source, thereby sustaining the source signal oscillation. The clock pulse apparatus also can include a frequency source having a crystal unit providing a source signal at a predetermined overtone frequency; and an overtone filter coupled with the negative resistance oscillator. The overtone filter can attenuate signals beyond a preselected passband generally centered around the predetermined overtone frequency.

The apparatus also can include a drive level control coupled with the negative resistance oscillator, the drive level control receiving a filtered base signal from the negative resistance oscillator and providing a level-regulated clock pulse signal at the predetermined clock operating frequency thereby. In one aspect of the clock pulse apparatus, the frequency source can include a crystal unit operated in series mode. In this case, the operating frequency of the crystal unit is an overtone frequency thereof, and the operating frequency of the crystal is substantially the same as the predetermined clock operating frequency. The clock pulse apparatus also can include a frequency multiplier generating a predetermined clock operating frequency which is a multiple of the predetermined overtone frequency.

In another aspect of the invention, apparatus can have a frequency source which is a micromechanical resonator providing a source signal at a predetermined overtone frequency; an overtone filter coupled with the negative resistance oscillator, with the filter attenuating signals from the negative resistance oscillator beyond a preselected passband generally centered around the predetermined overtone frequency; as well as a drive level control coupled with the negative resistance oscillator, which receives a filtered base signal from the negative resistance oscillator and provides a level-regulated clock pulse signal at the predetermined clock operating frequency thereby.

The overtone filter can be a bandpass filter with the center of a passband generally the same as a preselected passband centered around the predetermined overtone frequency. In addition, the overtone filter can be a plurality of bandpass filters with the center of a passband for selected ones of the bandpass filters generally the same as a preselected passband centered around the predetermined overtone frequency. Furthermore, the overtone filter can be a low-pass filter cascaded with a high-pass filter in which passbands of the highpass filter and low-pass filter are disposed to overlap such that a resulting passband is generally the same as a preselected passband centered around the predetermined overtone frequency. In another aspect of the present invention, the output of at least two of the plurality of bandpass filters are cross-coupled.

In yet another aspect of the invention, the negative resistance oscillator includes two current bias loops coupled by a transistor having a gate, and the drive level control provides a control signal to the gate such that a variable conductance between the two loops is provided.

In a further aspect of the clock pulse apparatus of the invention, the clock pulse signal can be provided at a predetermined clock operating frequency by a frequency source producing a source signal oscillating at a source frequency substantially the same as the predetermined clock operating frequency. The frequency source has a crystal unit operated in series mode providing the source signal at a predetermined overtone frequency, and the operating frequency of the crystal is substantially the same as the predetermined clock operating frequency. In addition, this aspect includes a negative resistance oscillator coupled with the frequency source. The negative resistance oscillator amplifies and feeds back at least a portion of the source signal to the frequency source, thereby sustaining the source signal oscillations.

This aspect of the apparatus also includes an overtone filter and a drive level control. The overtone filter is coupled with the negative resistance oscillator, the filter attenuating signals beyond a preselected passband generally centered around the predetermined overtone frequency. The drive level control is coupled with, and receives a filtered base signal from, the negative resistance oscillator, and provides a level-regulated clock pulse signal at the predetermined clock operating frequency thereby. This apparatus can include a frequency multiplier generating a predetermined clock operating frequency which is a multiple of the predetermined overtone frequency.

This aspect of the apparatus can also include an overtone filter which is bandpass filter, with the center of a passband generally the same as a preselected passband centered around the predetermined overtone frequency. In addition, the overtone filter can include a plurality of bandpass filters, with the center of a passband for selected ones of the bandpass filters being generally the same as a preselected passband centered around the predetermined overtone frequency. Moreover, the overtone filter can include a low-pass filter cascaded with a high-pass filter in which passbands of the highpass filter and low-pass filter are disposed to overlap, such that a resulting passband is generally the same as a preselected passband centered around the predetermined overtone frequency.

The invention also includes a method for producing a clock pulse, which generally includes the operations of producing a source signal from a frequency source at a preselected source frequency; amplifying the source signal to a base signal at a predetermined base signal frequency; feeding at least a portion of the base signal back to the frequency source sustaining oscillations thereby; filtering the base signal to provide a filtered base signal generally centered on the preselected source frequency; and level controlling the base signal to produce a clock signal at a clock operating frequency, wherein the clock operating frequency is substantially the same as the preselected source frequency.

In one aspect of the method, producing a source signal from a frequency source further can include providing a crystal unit frequency source and producing a source signal at a preselected overtone frequency of crystal unit frequency source. In addition, in another an aspect of the method, the filtering further includes bandpass filtering having a passband generally centered on the preselected overtone frequency. Alternatively, this aspect of filtering can further include cascading lowpass filtering and highpass filtering with a lowpass passband overlapping a highpass passband such that the resulting passband is generally centered on the preselected overtone frequency.

BRIEF DESCRIPTION OF THE DRAWINGS

These and other features, aspects and advantages of the present invention will be more fully understood when considered with respect to the following detailed description, appended claims and accompanying drawings, wherein:

DETAILED DESCRIPTION

The invention provides a stable, high-frequency clock pulse apparatus and method. In the apparatus a CMOS oscillator is employed, with the oscillator including a resonator and a sustaining circuit. In general, the resonator develops the oscillations by providing a periodic resonance signal, typically a voltage signal, to a sustaining circuit, which, in turn, feeds back an amplified resonance signal to the resonator. These periodic oscillations can be representative of clock transitions occurring at a particular frequency. Taken together, the amplifying sustaining circuit and the resonator form the oscillator of a frequency determining circuit.

Oscillator applications sometimes require operating frequencies substantially higher than the natural resonance frequency of a crystal. As such, quartz crystals can be manufactured to operate in an overtone mode at frequencies, called overtone frequencies, which lie above its fundamental frequency. Because crystals tend to exhibit the same reactance-frequency characteristics at odd overtone frequencies as at the fundamental frequency, odd overtone modes are used. Overtone multiples tend to be non-integer multiples of the fundamental frequency. In some circumstances, overtone operation improves the overall oscillator quality factor. High stability quartz crystals can achieve a high Q, for example, producing an output signal at, for example, a third or fifth overtone frequency.

When using an overtone crystal oscillator, it can be important to suppress operation of a crystal at the fundamental mode, and at undesirable overtones. Otherwise, the circuit may attempt to oscillate at the fundamental frequency or unpredictably at the fundamental and undesired overtones. Thus, it is desirable to inhibit such potential instability in the oscillator design, which could add a potential source of jitter. The oscillator of the invention minimizes jitter by reducing the number of linear components, employing a frequency determining circuit operated in the series resonance mode, as well as a producing steady state operating conditions which generally are independent of the resonator and sustaining circuit, and by being insensitive to power supply voltage variations. For higher frequencies, where overtone crystal units are used as resonators, the invention accommodates overtone operation by supressing spurious, unwanted overtones and the fundamental frequencies; thereby controlling the AC drive current through and drive voltage across the crystal unit.

Figure 1:
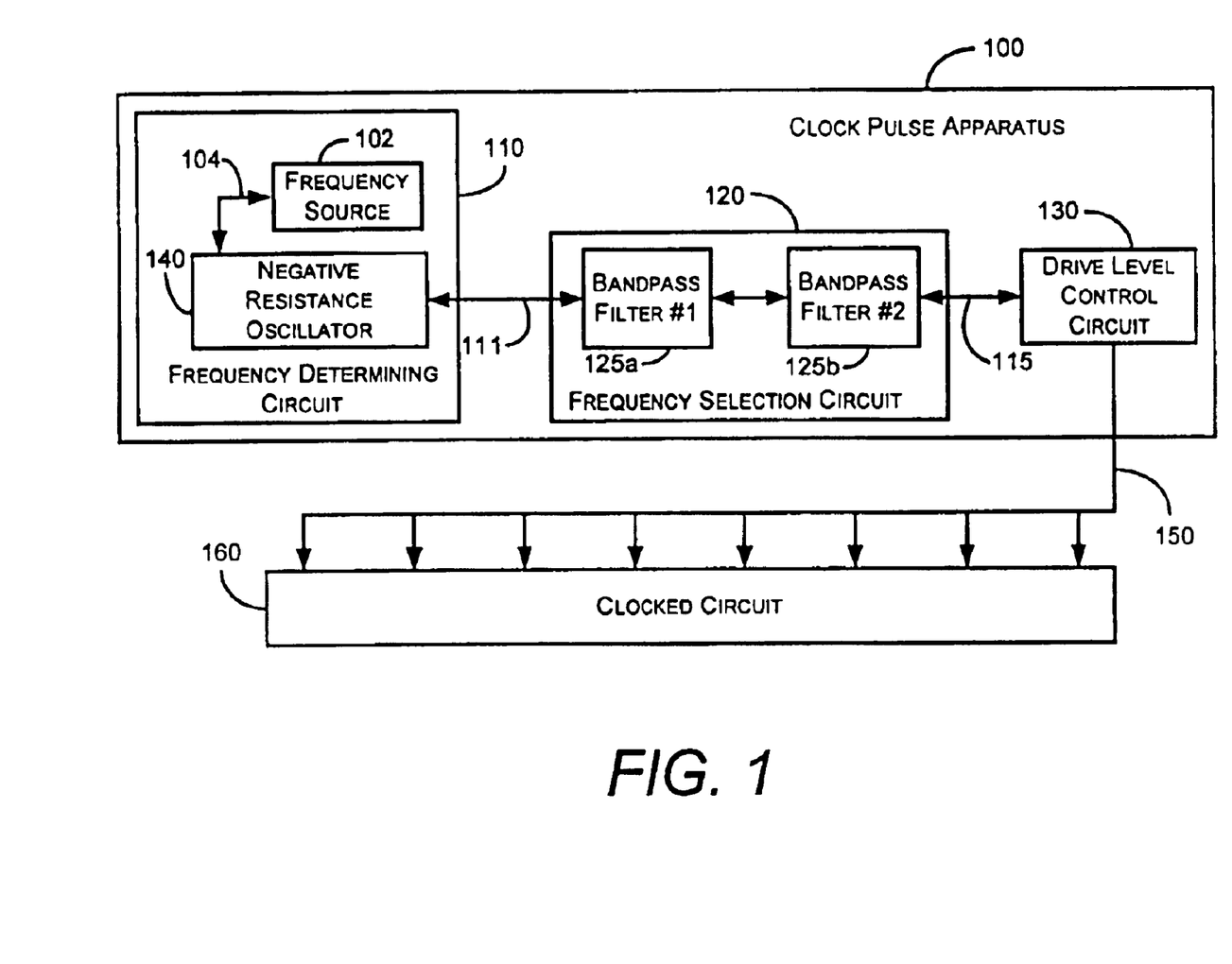
FIG. 1 is a general block diagram of one embodiment of a clock pulse apparatus.

FIG. 1 illustrates an electronic clock pulse apparatus 100, which includes a frequency determining circuit 110, a frequency selection circuit 120, and a drive level control circuit 130. The clock pulse apparatus provides a clock pulse signal 150 to clocked circuit 160, at a regulated predetermined clock operating frequency. The frequency determining circuit generates a base signal 111 at a predetermined frequency. In one embodiment, the frequency determining circuit includes a resonator or frequency source 102, which can be a piezolelectric device, such as a quartz crystal, disposed to operate at a preselected overtone frequency of the crystal. The frequency source provides a source signal 104. Where a crystal unit is employed for the frequency source, source frequency of the frequency source is substantially the series resonant frequency of the crystal unit which can be described by the relationship:

$$f_s = \frac{1}{2\pi\sqrt{L_s C_s}}$$

where $L_s$ and $C_s$ are the respective values of series resonant inductance and series resonant capacitance at the desired overtone frequency.

Coupled with the frequency source, a negative resistance oscillator 140 can serve as a sustaining circuit, receiving the source signal and being energized to produce the base signal 111. It is desirable that the frequency source appear as a primarily resistive device, and not primarily inductive, thus the frequency determining circuit 110 is disposed to operate in a low impedance, series resonant mode. In another aspect of the invention, frequency source 102 is a high-Q polysilicon micromechanical (MEMS) resonator formed using, for example, standard VLSI CMOS fabrication and surface-micromachining processes. In such an instance, a sustaining circuit can also be employed to sustain resonance and to constrain the frequency source to operate within a frequency passband approximately centered on a preselected source frequency.

Because of the relatively high output resistance of MOS devices operating in the saturated region, the negative resistance oscillator tends to be relatively insensitive to power supply variations. In general, a preselected overtone frequency of the frequency source is selected to be substantially the same as a predetermined frequency of the base signal 111 and the clock operating frequency of the clock signal 150.

In another aspect of the invention, the frequency selection circuit 120 includes two filters 125a,b which are coupled to the frequency determining circuit 110, and which receives, and is responsive to, the base signal. The filters 125a,b are disposed to maintain a narrow frequency passband approximately centered on the preselected overtone frequency, and thus also can be selective for the clock operating frequency of clock signal 150. In this manner, the frequency selection circuit compels the frequency determining circuit to operate at the preselected overtone frequency, and not drift to other, undesired overtone frequency, or to the fundamental frequency of the crystal. Thus potential disruption of the operation of clock pulse apparatus is minimized. The filters 125a,b can be bandpass filters, as well as cascaded highpass and lowpass filters. In one embodiment, the drive level control circuit 130 can be used to control the AC current supplied to the frequency determining circuit, such that the AC current through the frequency source is substantially stabilized. Therefore, jitter is minimized.

Figure 2:
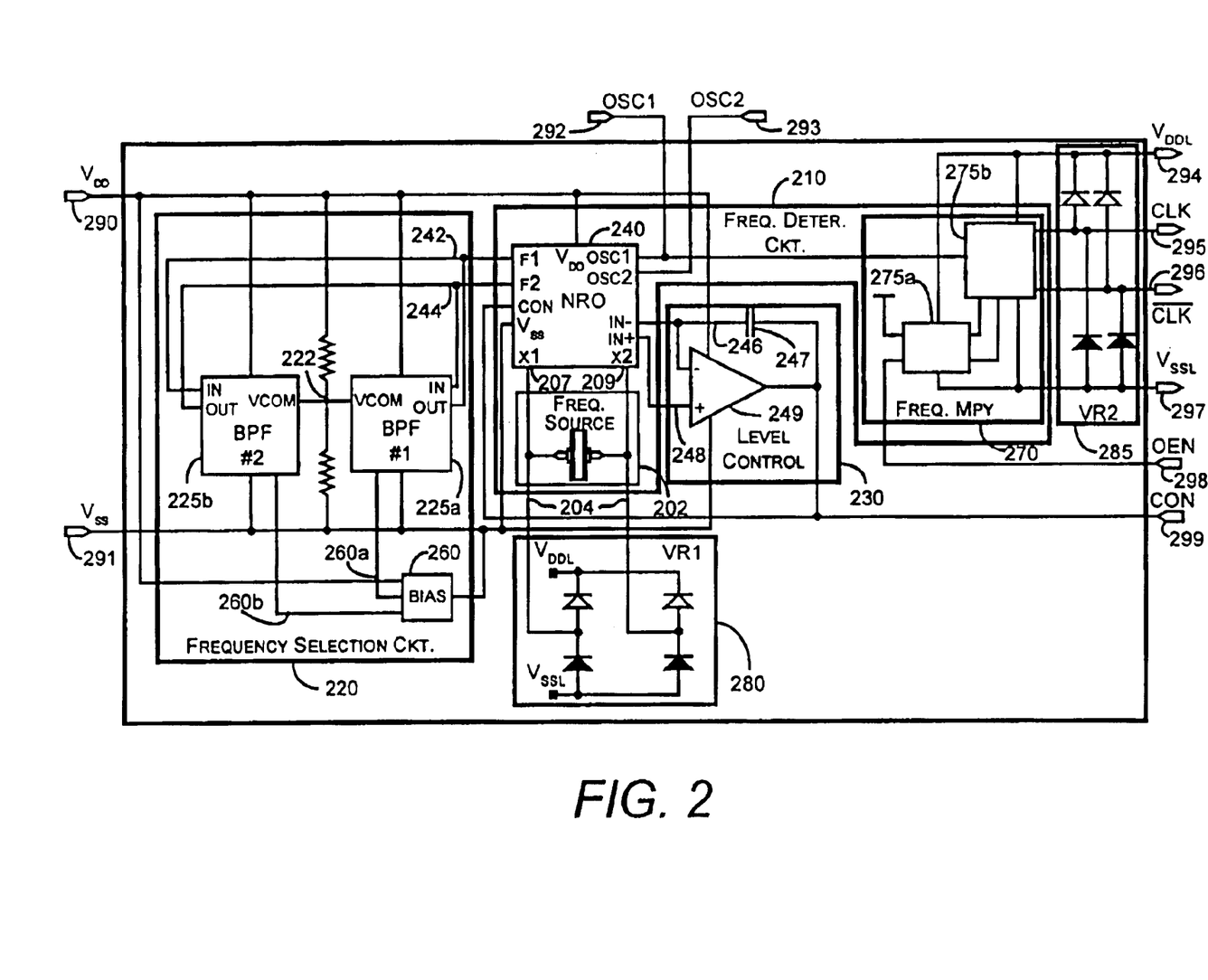
FIG. 2 is a semi-schematic diagram of another aspect of a clock pulse apparatus.

FIG. 2 illustrates another aspect of a clock pulse apparatus which includes a frequency determining circuit 210, a frequency selection circuit 220, and a drive level control circuit 230, operably coupled with, and responsive to, each other to produce clock pulse signals CLK 295 and $\overline{CLK}$ 296. The apparatus is generally powered by power signals $V_{DD}$ 290 and $V_{SS}$ 291. The frequency determining circuit 210 employs a frequency source 202 as a resonator, and a negative resistance oscillator (NRO) 240 as a sustaining circuit. Together, the frequency source and the NRO, cooperate to provide a base signal 211 at a predetermined base signal frequency.

In particular, the frequency source provides a source signal 204 at a preselected source frequency, through frequency source outputs X1 207 and X2 209 to the NRO. The frequency source, in one embodiment, is a crystal unit operating in an overtone mode at a preselected overtone frequency. Additional information regarding a NRO may be found, for example, U.S. Pat. No. 4,122,414, "CMOS Negative Resistance Oscillator", issued to Patterson, on Oct. 24, 1978, which reference is incorporated herein in its entirety. Furthermore, previous NROs were not used in conjunction with either a frequency selection circuit, such as frequency selection circuit 220, or a drive level control, such as, for example, drive level control circuit 230, to produce a stable, high-frequency clock pulse, as provided by the invention.

The NRO makes use of negative dynamic resistance to selectively augment and maintain base signal OSC1 292 at a predetermined base signal frequency, thereby providing a stable resonance feedback to and sustaining the resonance within the frequency source. The predetermined base signal frequency is substantially the same as the preselected overtone frequency of the frequency source. As such, the NRO is resistant to unwanted variations of characteristics of feedback and power signals supplied to the NRO, thus inhibiting the frequency source from operating at spurious frequencies, including the fundamental frequency and any undesired overtone frequencies. The range of frequencies produced by the NRO is generally centered around the predetermined base signal frequency and is further constrained by the frequency selection circuit 220.

The frequency selection circuit 220, in one embodiment, employs two bandpass filters 225a and 225b, which are cross-coupled to the NRO to circumscribe the range of passband frequencies to one generally centered on the predetermined base signal frequency. Cross-coupling filters 225a and 225b involves coupling a NRO base signal F1 242 with an input of filter 225a and with the output of the filter 225b. Similarly, a NRO base signal F2 244 is coupled with an input of the filter 225b and with the output of the filter 225a. Nodes F1 and F2 from the NRO each provide an inverting input to the respective bandpass filters 225a and 225b. The non-inverting inputs of filters are tied together at VCOM 222 which short circuits current between the two bias loops formed by the respective filters except in a band encompassing the desired crystal overtone frequencies. In one embodiment, the frequency selection circuit uses an active filter with passive RC components, realizable with a standard CMOS fabrication process. Such an active filter is discussed relative to FIG. 4. In addition, filters 225a,b, in one embodiment, are provided by an off-chip filter, such as one containing RLC components.

In one aspect of the invention, the drive level control 230 incorporates an integrator 249 having an integrating capacitor 247, which feeds back a control current to the NRO 240. As such, the AC voltage across, and thus the AC current supplied to, the frequency source is stabilized. This, in turn, results in further stabilization of NRO output OSC1 292. Integrating capacitor 247 of integrator 249 can be disposed to have a long time constant, while connecting IN− 246 of the NRO and output CON 299. Integrator 249 compares a crystal current signal 204 to a reference current and adjusts the voltage level of output CON 299 accordingly.

Drive level control 230 is also coupled with IN+ and IN− of the NRO which provides a current representative of the crystal current signal to the integrator. In particular, the NRO applies representative signals IN− 246 and IN+ 248 to the inverting and non-inverting inputs of the integrator. Additional protection from anomalous supply voltages to the frequency source is provided, in one embodiment, by voltage regulator 280.

In one aspect of the invention, signal OSC1 292 is supplied to a frequency multiplier circuit 270 to further increase the output clock pulse train frequency on CLK 295 and $\overline{CLK}$ 296. An enabling latch 275a is activated by an OEN signal 298 which enables a logic circuit 275b to provide clock pulse signals CLK 295 and $\overline{CLK}$ 296, each at a clock operating frequency and a logical complement of the other. In general, the clock operating frequency is substantially the same as the preselected source frequency. In addition, latch 275a and logic circuit 275b provide a lower-voltage supply via outputs $V_{DDL}$ 294 and $V_{SSL}$ 296. The lower-voltage supplies are used in conjunction with exemplary voltage regulator 285 to afford additional protection from anomalous voltage levels on signals CLK 295 and $\overline{CLK}$ 296. In one aspect of the invention, the only external component may be a crystal unit connected to X1 207 and X2 209. In another aspect, as indicated above, X1 207 and X2 209 can be coupled with a micromechanical resonator which is monolithically fabricated in a CMOS process along with apparatus 200.

Figure 3:
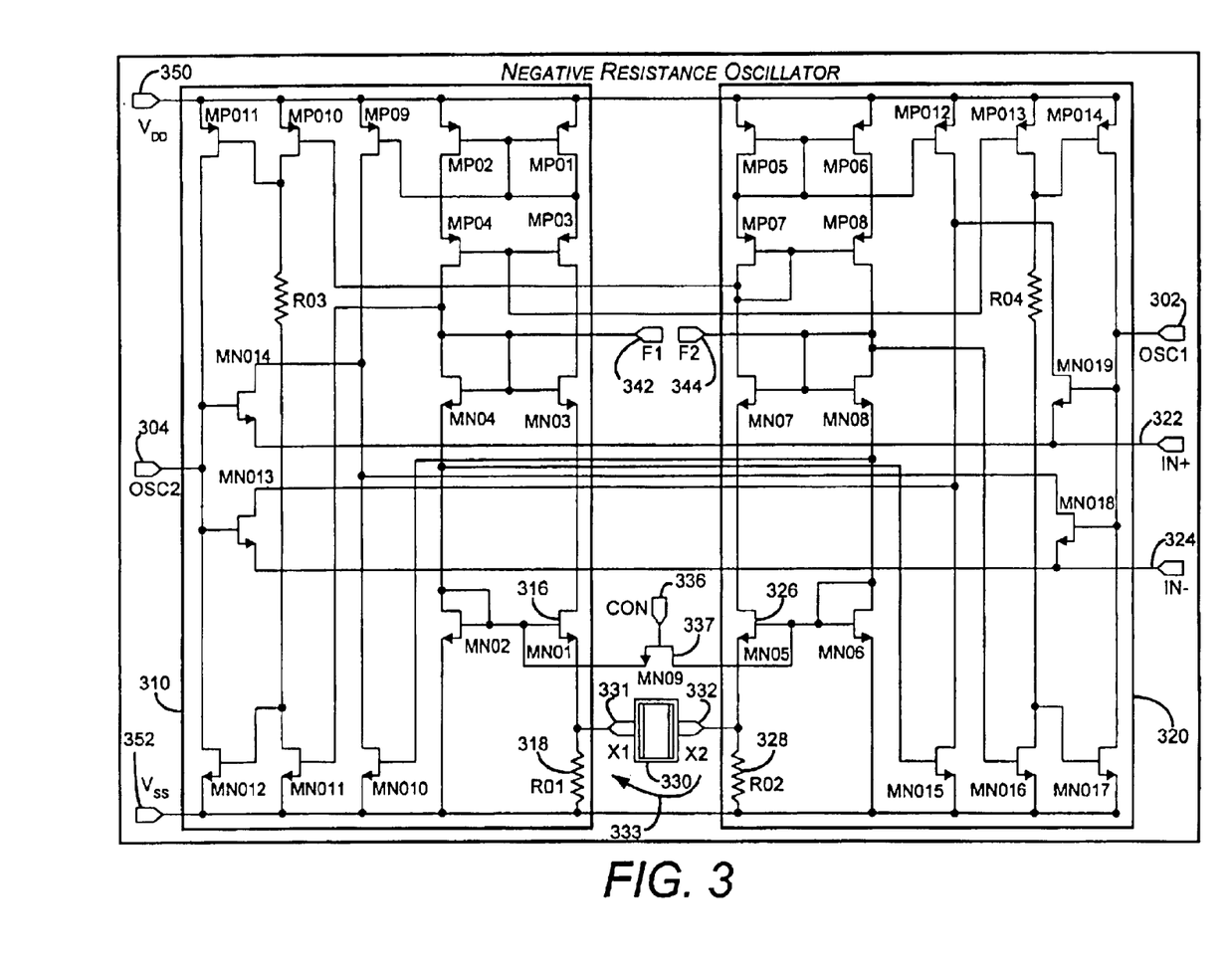
FIG. 3 is a schematic diagram of a negative resistance oscillator.

FIG. 3 illustrates the configuration and operation of negative resistance oscillator, which can be used, for example, as NRO 240 in FIG. 2. In FIG. 3, a frequency source 330 provides a source current signal 333 at a preselected overtone frequency through frequency source contacts X1 331 and X2 332 to the negative resistance oscillator (NRO). The NRO includes two current bias loops 310 and 320 to permit a full differential drive to a crystal unit in the frequency source, and to more readily make the conversion from sensed current variations through the frequency source into rail-to-rail output voltage swings in signals OSC1 302 and OSC2 304. The negative dynamic resistance developed by NRO 300 is perceived, for example, when observing the resistor-source node of the respective current bias loop, such as contact X1 331 in the current bias loop 310, and contact X2 332 in the other current bias loop 320.

Signal CON 336 is provided by, for example, an integrator (FIG. 2) and is coupled with the gate of NFET MN09 337 to provide a variable conductance between the two current bias loops 310 and 320 of the oscillator. Upon start-up, the signal CON is low such that NFET MN09 does not conduct substantially. As oscillation begins, the voltage on signal CON rises. Because of the long time constant used with the integrator, such as integrator 249 (FIG. 2), current along current path 333 will gradually rise to a value generally determined by a driving circuitry of oscillator and the series resistance of frequency source 330, e.g., the crystal series resistance.

An exemplary driving circuitry is shown in FIG. 3 and includes transistor MN01 316 and resistor R01 318 in current bias loop 310, as well as transistor MN05 326 and resistor R02 328 in current bias loop 320. Referring briefly to FIG. 2, in one embodiment, after integrating capacitor 247 has charged, the integrator amplifier 249 generally responds by raising the voltage applied to signal CON 336. As such, when transistor MN09 337 begins to conduct, crystal drive current is shunted from one oscillator bias loop, e.g., the first current bias loop 310, to the other oscillator bias loop, e.g., the second current bias loop 320.

Drive level control circuit, such as circuit 230 (FIG. 2), subtracts from an internal reference current, a full wave rectified output proportional to the crystal current, such as sensed on inputs 246 and 248, and feeds the resulting current via the CON signal 336 (299) back to transistor MN09. The transistor MN09 is then used as a variable conductor between the two oscillator current bias loops.

Figure 4:
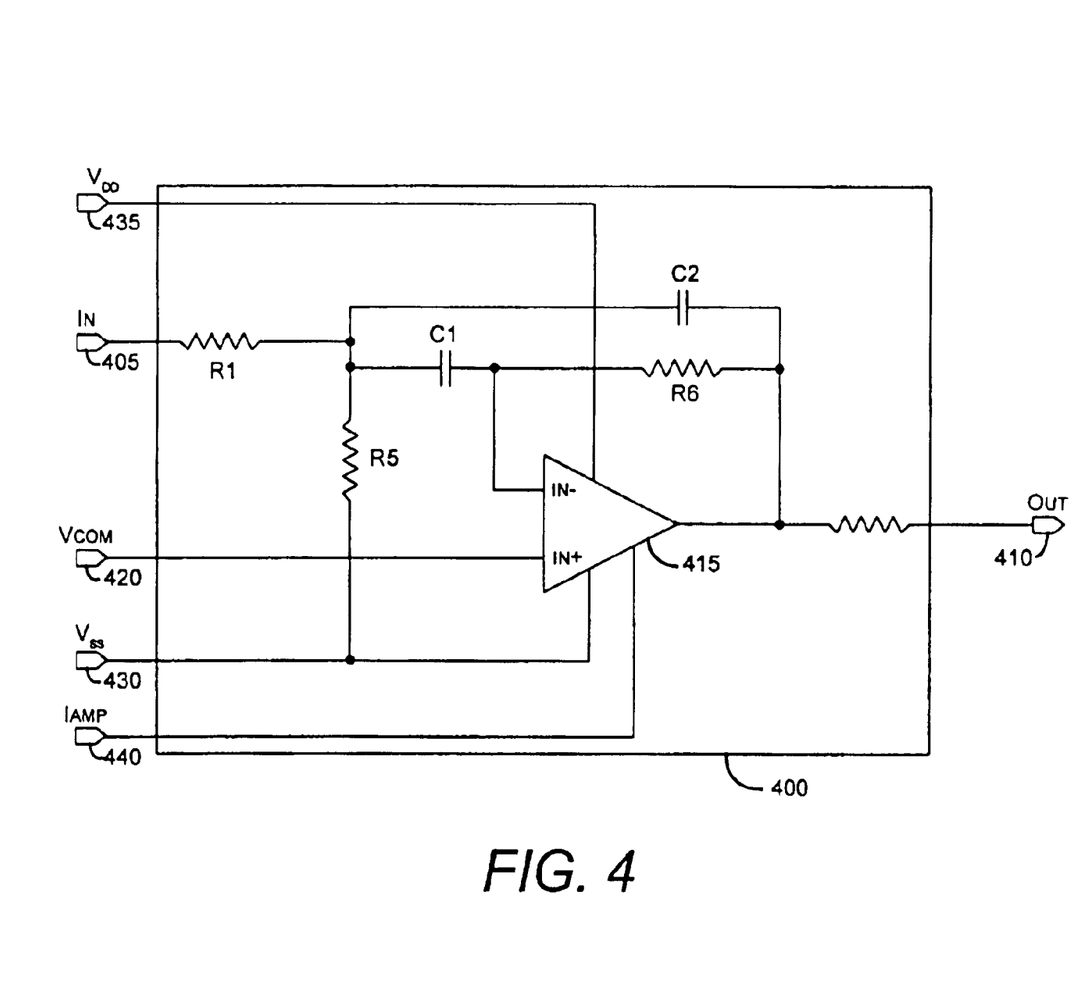
FIG. 4 is a schematic diagram of an overtone filter.

FIG. 4 illustrates one aspect of a bandpass filter, such as found, for example, in filters described in FIGS. 1 and 2. Exemplary filter 400 can be a well-known second-order implementation of an active filter of the infinite gain multiple feedback (IGMF) type, and can be fabricated, for example, using a standard CMOS process adapted for high-speed devices. In general, the bandpass filter is disposed to provide a gain of about −1 at the center frequency of the passband, which generally is the predetermined base signal frequency. The filter is powered by signals $V_{DD}$ 435 and $V_{SS}$ 430. VCOM 420 of a first filter 400 is tied to VCOM 420 of a second filter 400. VCOM 420 is coupled with the noninverting input of amplifier 415. Amplifier 415 is biased using $I_{AMP}$ 440, which can be supplied, as appropriate, by bias signals 260*a,b* from a bias circuit 260 (FIG. 2).

Signal IN 405 is coupled with the inverting input of amplifier 415 through the passive elements R1, C1, C2, and R6 of a feedback network. These passive elements influence the frequency response of the filter. In general, it is desirable that the bandwidth of the filter be narrow enough to exclude the nearest undesirable overtones and spurious frequencies developed by a resonator, e.g., the crystal unit of frequency source 202 in FIG. 2. As a result, signal OUT 410 provides a filtered output signal from the filter. Such a signal can be cross-coupled to the input IN 405 of a second filter 400, as illustrated by the configuration of filters 225*a,b* in FIG. 2.

Figure 5A:
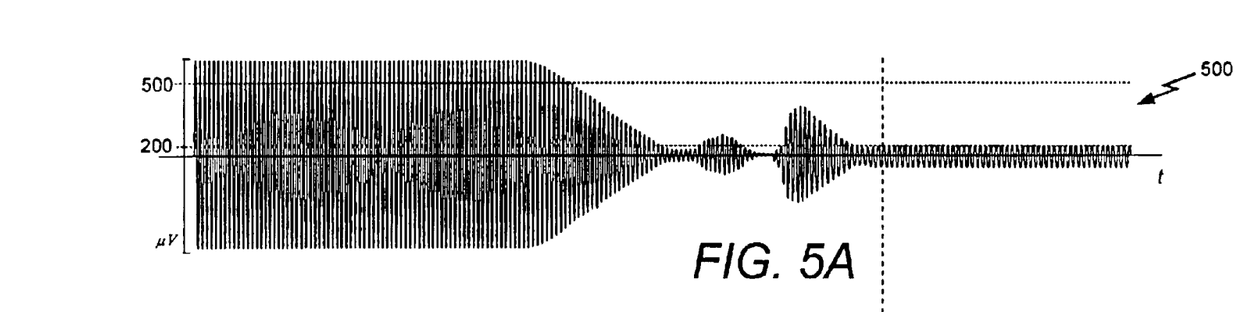
FIG. 5A is an illustrative plot of a crystal current, during startup.
Figure 5B:
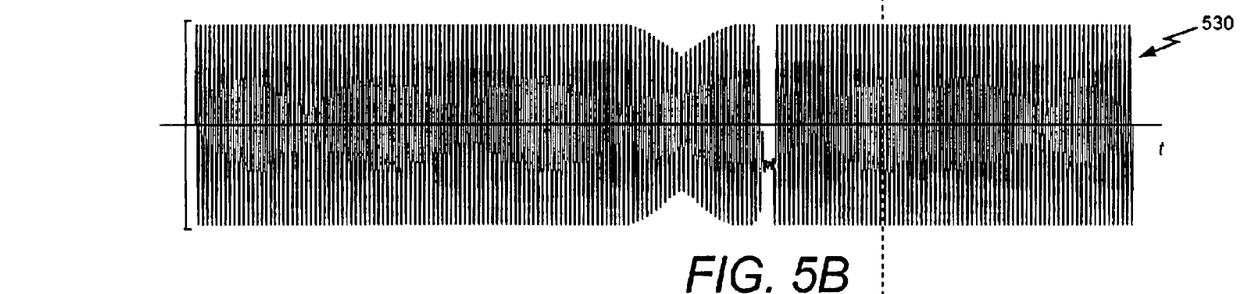
FIG. 5B is an illustrative plot of a clock signal CLK, during startup.
Figure 5C:
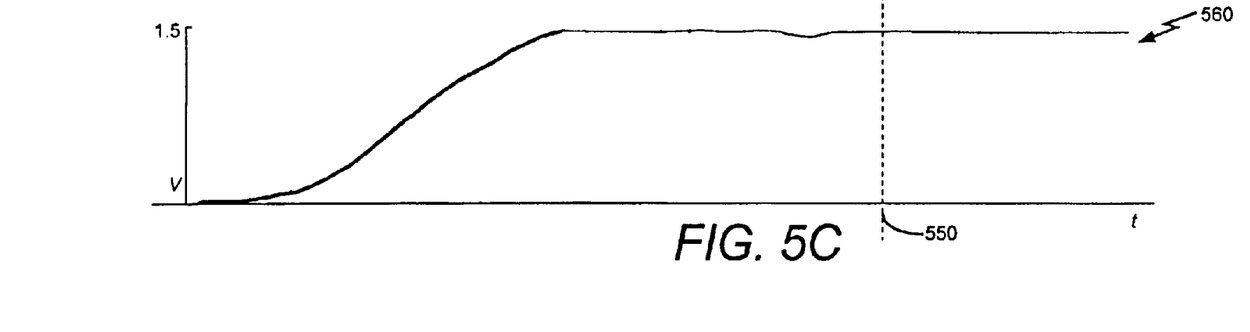
FIG. 5c is an illustrative plot of a control signal CON, during startup.

With concurrent reference to FIGS. 2 and 3, where appropriate, FIG. 5A–C illustrates exemplary plots for a crystal current signal, a clock signal CLK, and a signal CON, respectively, during a typical startup sequence, for example, for a clock pulse apparatus. Corresponding signals in FIG. 2, for example, are source signal 204, CLK 295, and CON 299. In FIG. 5A–C, line 550 is generally indicative of steady state operation. In FIG. 5A, initially, source signal current through the magnitude of a frequency source begins somewhat above about ±500 µA, as indicated by current waveform 500. As the frequency source reaches steady state, the source signal current also reaches a steady state magnitude of about ±200 µA, also as shown by current waveform 500. Also at start-up, the signal CON in FIG. 5c and shown by CON waveform 560 is about zero volts, rising to approximately 1.5 volts, once steady state is reached. By steady-state indicative of line 550, the signal CLK is stabilized relative to frequency and amplitude fluctuation, such that a stable low-jitter periodic signal is produced as shown by CLK waveform 530.

Figure 6A:
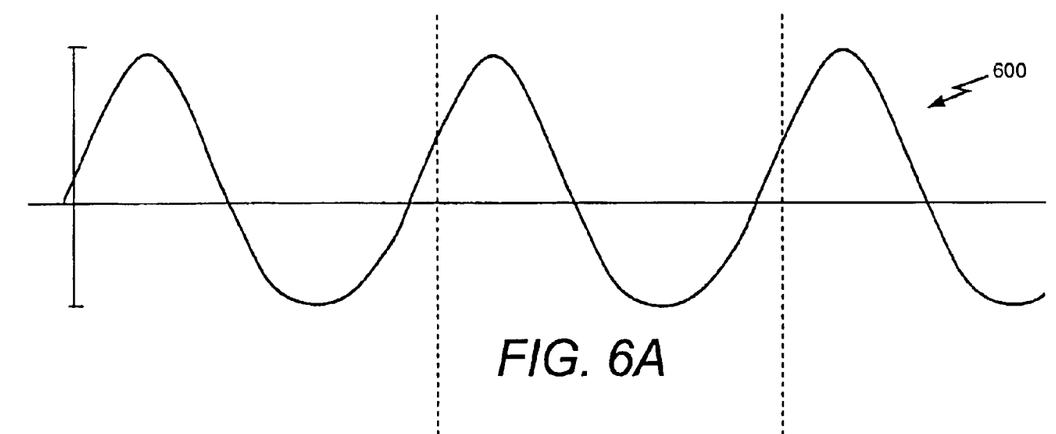
FIG. 6A is an illustrative plot of a crystal current generated without use of a drive control circuit.
Figure 6B:
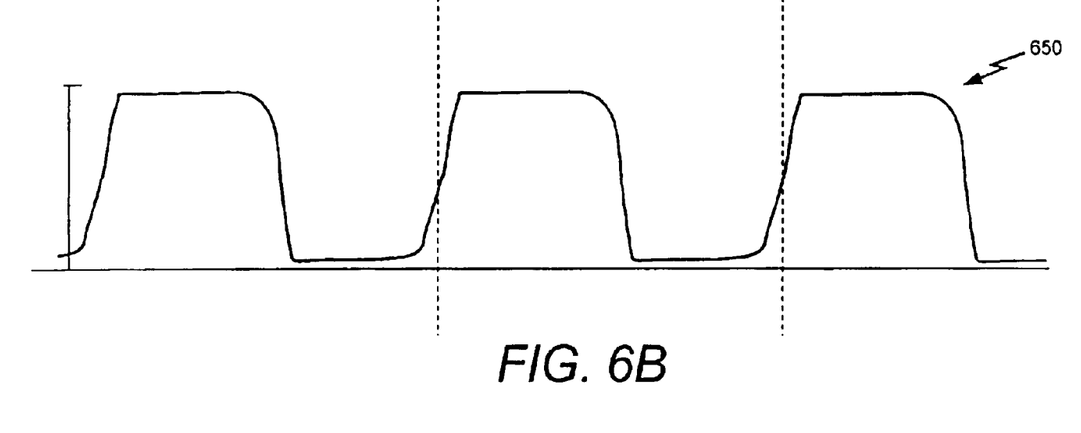
FIG. 6B is an illustrative plot of a clock signal CLK generated without use of a drive control circuit.

FIG. 6 is an illustration of steady-state values for a crystal current 600 and a clock signal CLK 650, as generated without a drive level control circuit. The magnitude of the crystal current indicates that the crystal unit, such as may be found in frequency source 202, may be overdriven. Over-driving a crystal unit can induce instability and thus shorten its service life. In addition, the shape of signal CLK is neither smoothed nor rounded indicating the potential presence of additional sources of jitter in the clock pulse apparatus output. Furthermore, the rail-to-rail voltage swing of signal CLK is highly irregular and non-linear.

Figure 7A:
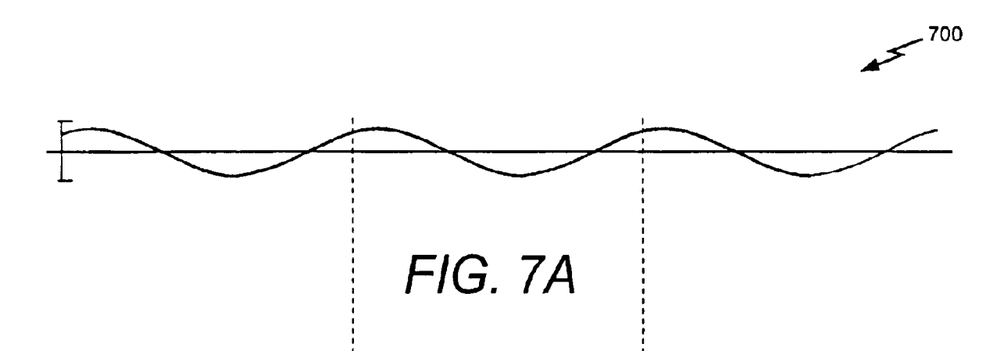
FIG. 7A is an illustrative plot of a crystal current generated with the use of a drive control circuit.
Figure 7B:
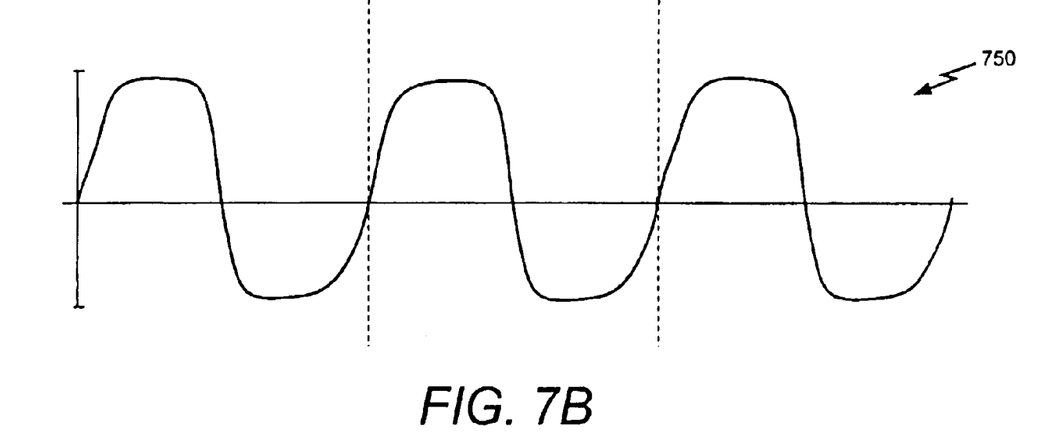
FIG. 7B is an illustrative plot of a clock signal CLK generated with the use of a drive control circuit.

By contrast, FIG. 7 illustrates steady-state values for a crystal current 700 and a clock signal CLK 750, as influenced by the operation of a drive level control circuit. Relative to the crystal current 600 in FIG. 6, the crystal current 700 is of lesser magnitude due to the level control features, for example, of circuit 230 (FIG. 2). Such constrained driving of the crystal unit, e.g., source 202 in FIG. 2, can provide the benefits of producing a highly-stable, smoothed signal over an extended crystal unit service life. As a result, jitter is also reduced. Due to the reduced drive levels, the quality of the resonator can be maximized, making oscillation less subject to influence by a drive circuit. Because the crystal current develops a smooth, sinusoidal waveform, and a clock signal CLK 750 provides a smoothed, regular, rail-to-rail voltage swing, jitter can be reduced substantially.

Figure 8:
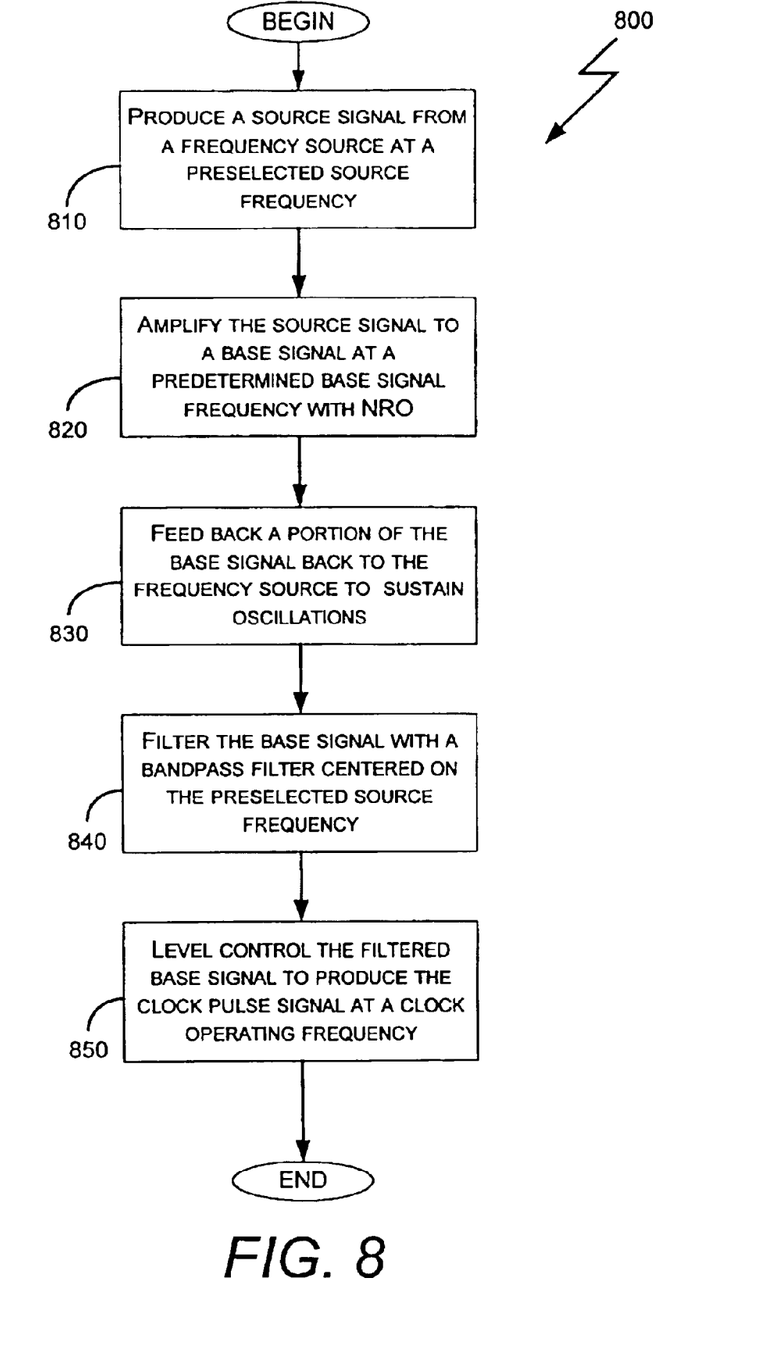
FIG. 8 illustrates a flow diagram of one embodiment of a process to provide a stable high-frequency clock pulse.

FIG. 8 is a flow-diagram of an aspect of a method for producing a clock pulse according to the invention. The method includes producing a source signal from a frequency source at a preselected source frequency, block 810, with the source signal being amplified to a base signal at a predetermined base signal frequency, block 820. The source signal, in one embodiment, is produced by a crystal unit operating at a preselected overtone frequency, and supplied to a sustaining circuit, such as a negative resistance oscillator, operating in an overtone mode. At least a portion of the base signal can be fed back to the signal source to sustain oscillations, block 830. The base signal is bandpass filtered to provide a filtered base signal generally centered on the preselected source frequency, block 840. Further, the base signal is level controlled to produce a clock signal at a clock operating frequency, block 850. In general, the clock operating frequency is substantially the same as the preselected source frequency.

Many alterations and modifications may be made by those having ordinary skill in the art, without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth, but all equivalent elements for performing substantially the same function in substantially the same way to obtain substantially the same result. The claims are thus to be understood to include what is specifically illustrated and described above, what is conceptually equivalent, and also what incorporates the ideas of the invention.

What is claimed is:

1. A clock pulse apparatus providing a clock pulse signal at a predetermined clock operating frequency, the apparatus comprising a frequency source producing a source signal oscillating at a source frequency substantially the same as the predetermined clock operating frequency, the frequency source being coupled with a negative resistance oscillator, the oscillator amplifying and feeding back at least a portion of the source signal to the frequency source to sustain the source signal oscillating thereby.

2. The clock pulse apparatus of claim 1, further comprising:
   a frequency source having a crystal unit providing a source signal at a predetermined overtone frequency; and
   an overtone filter coupled with the negative resistance oscillator, the filter attenuating signals beyond a preselected passband generally centered around the predetermined overtone frequency.

3. The clock pulse apparatus of claim 2, further comprising a drive level control coupled with the negative resistance oscillator, the drive level control receiving a filtered base signal from the negative resistance oscillator and providing a level-regulated clock pulse signal at the predetermined clock operating frequency thereby.

4. The clock pulse apparatus of claim 2, wherein the frequency source comprises a crystal unit operated in series mode with the operating frequency of the crystal unit being an overtone frequency thereof, and wherein the operating frequency of the crystal is substantially the same as the predetermined clock operating frequency.

5. The clock pulse apparatus of claim 1, further comprising:
   a frequency source having a micromechanical resonator providing a source signal at a predetermined overtone frequency;
   an overtone filter coupled with the negative resistance oscillator, the filter attenuating signals from the negative resistance oscillator beyond a preselected passband generally centered around the predetermined overtone frequency; and
   a drive level control coupled with the negative resistance oscillator, the drive level control receiving a filtered base signal from the negative resistance oscillator and providing a level-regulated clock pulse signal at the predetermined clock operating frequency thereby.

6. The clock pulse apparatus of claim 2, wherein the overtone filter is bandpass filter with the center of a passband generally the same as a preselected passband centered around the predetermined overtone frequency.

7. The clock pulse apparatus of claim 6, wherein the overtone filter comprises a plurality of bandpass filters with the center of a passband for selected ones of the bandpass filters generally the same as a preselected passband centered around the predetermined overtone frequency.

8. The clock pulse apparatus of claim 6, wherein the overtone filter comprises a low-pass filter cascaded with a high-pass filter in which passbands of the highpass filter and low-pass filter are disposed to overlap such that a resulting passband is generally the same as a preselected passband centered around the predetermined overtone frequency.

9. The clock pulse apparatus of claim 5, further comprising a frequency multiplier generating a predetermined clock operating frequency which is a multiple of the predetermined overtone frequency.

10. The clock pulse apparatus of claim 3, wherein the negative resistance oscillator comprises two current bias loops coupled by a transistor having a gate, and the drive level control provides a control signal to the gate such that a variable conductance between the two loops is provided thereby.

11. The clock pulse apparatus of claim 7, wherein output of at least two of the plurality of bandpass filters are cross-coupled.

12. A clock pulse apparatus providing a clock pulse signal at a predetermined clock operating frequency, the apparatus comprising:

a frequency source producing a source signal oscillating at a source frequency substantially the same as the predetermined clock operating frequency, the frequency source having a crystal unit operated in series mode providing the source signal at a predetermined overtone frequency and wherein the operating frequency of the crystal is substantially the same as the predetermined clock operating frequency;

a negative resistance oscillator coupled with the frequency source, the negative resistance oscillator amplifying and feeding back at least a portion of the source signal to the frequency source, sustaining the source signal oscillating thereby;

an overtone filter coupled with the negative resistance oscillator, the filter attenuating signals beyond a preselected passband generally centered around the predetermined overtone frequency; and a drive level control coupled with the negative resistance oscillator, the drive level control receiving a filtered base signal from the negative resistance oscillator and providing a level-regulated clock pulse signal at the predetermined clock operating frequency thereby.

13. The clock pulse apparatus of claim 12, wherein the overtone filter is bandpass filter with the center of a passband generally the same as a preselected passband centered around the predetermined overtone frequency.

14. The clock pulse apparatus of claim 13, wherein the overtone filter comprises a plurality of bandpass filters with the center of a passband for selected ones of the bandpass filters generally the same as a preselected passband centered around the predetermined overtone frequency.

15. The clock pulse apparatus of claim 13, wherein the overtone filter comprises a low-pass filter cascaded with a high-pass filter in which passbands of the highpass filter and low-pass filter are disposed to overlap such that a resulting passband is generally the same as a preselected passband centered around the predetermined overtone frequency.

16. The clock pulse apparatus of claim 12, further comprising a frequency multiplier generating a predetermined clock operating frequency which is a multiple of the predetermined overtone frequency.

17. A method for producing a clock pulse, comprising:

producing a source signal from a frequency source at a preselected source frequency;

amplifying the source signal to a base signal at a predetermined base signal frequency;

feeding at least a portion of the base signal back to the frequency source sustaining oscillations thereby;

filtering the base signal to provide a filtered base signal generally centered on the preselected source frequency; and level controlling the base signal to produce a clock signal at a clock operating frequency, wherein the clock operating frequency is substantially the same as the preselected source frequency.

18. The method of claim 17, wherein producing a source signal from a frequency source further comprises providing a crystal unit frequency source and producing a source signal at a preselected overtone frequency of crystal unit frequency source.

19. The method of claim 18, wherein the filtering further comprises bandpass filtering having a passband generally centered on the preselected overtone frequency.

20. The method of claim 18, wherein the filtering further comprises cascading lowpass filtering and highpass filtering with a lowpass passband overlapping a highpass passband such that the resulting passband is generally centered on the preselected overtone frequency.

\* \* \* \* \*